(12) United States Patent
Cali et al.

(10) Patent No.: US 9,450,595 B2
(45) Date of Patent: Sep. 20, 2016

(54) N-PATH CASCODE TRANSISTOR OUTPUT SWITCH FOR A DIGITAL TO ANALOG CONVERTER

(71) Applicant: BAE SYSTEMS Information and Electronic Systems Integration Inc., Nashua, NH (US)

(72) Inventors: Joseph D. Cali, Nashua, NH (US); Lawrence J. Kushner, Andover, MA (US); Steven E. Turner, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/958,051

(22) Filed: Dec. 3, 2015

(65) Prior Publication Data

US 2016/0173113 A1   Jun. 16, 2016

Related U.S. Application Data

(60) Provisional application No. 62/091,034, filed on Dec. 12, 2014.

(51) Int. Cl.
| | |
|---|---|
| *H03M 1/66* | (2006.01) |
| *H03M 1/06* | (2006.01) |
| *H01L 29/737* | (2006.01) |
| *H01L 29/73* | (2006.01) |
| *H01L 27/06* | (2006.01) |

(52) U.S. Cl.
CPC ........ *H03M 1/0626* (2013.01); *H01L 27/0605* (2013.01); *H01L 27/0617* (2013.01); *H01L 29/73* (2013.01); *H01L 29/737* (2013.01); *H03M 1/66* (2013.01)

(58) Field of Classification Search
CPC ..... H03M 1/0626; H03M 1/66; H01L 29/16; H01L 29/73; H01L 29/778; H01L 29/737; H01L 27/0605; H01L 27/0617
USPC .................................................. 341/136, 144
See application file for complete search history.

(56) References Cited

U.S. PATENT DOCUMENTS 7,026,971 B2 *   4/2006   Horsky ................. H03M 1/682
                                                              341/145

(Continued)

*Primary Examiner* — Brian Young
(74) *Attorney, Agent, or Firm* — Finch & Maloney PLLC; Scott J. Asmus; Daniel J. Long

(57) ABSTRACT

Techniques are provided for a switched output digital to analog converter employing an N-path cascode output switch. An example system may include a plurality of cascode transistors coupled in parallel to an output stage of a current mode digital to analog converter (DAC) circuit. The system may also include a plurality of control ports, each of the control ports coupled to a gate of one of the cascode transistors. The system may further include a plurality of output ports, each output port coupled to one of the cascode transistors. The cascode transistors are configured to switch the output stage of the DAC to the output port of the transistor in response to a routing control signal applied to the control port of the transistor. The cascode transistors are High Electron Mobility Transistors (HEMT) fabricated from Gallium Nitride.

25 Claims, 6 Drawing Sheets

(56) References Cited

U.S. PATENT DOCUMENTS 7,129,871 B1* 10/2006 Venes ................. H03F 3/45089
341/135
7,629,910 B2* 12/2009 Ramadoss ........... H03M 1/0881
341/136
8,089,097 B2* 1/2012 D'Evelyn ............... C30B 25/02
257/194
8,441,382 B2* 5/2013 Mahajan .............. H03K 17/063
341/121

* cited by examiner

500

---

Couple a plurality of cascode transistors in parallel to an output stage of a current mode digital to analog converter (DAC) circuit.

510

↓

Provide a plurality of control ports, each of the control ports coupled to a gate of one of the cascode transistors.

520

↓

Provide a plurality of output ports, each output port coupled to one of the cascode transistors. The cascode transistors are configured to switch the output stage of the DAC to the output port of the transistor in response to a routing control signal applied to the control port of the transistor.

N-PATH CASCODE TRANSISTOR OUTPUT SWITCH FOR A DIGITAL TO ANALOG CONVERTER

CROSS-REFERENCE TO RELATED APPLICATIONS

This Application claims the benefit of U.S. Provisional Patent Application No. 62/091,034, filed on Dec. 12, 2014, which is herein incorporated by reference in its entirety.

STATEMENT OF GOVERNMENT INTEREST

This invention was made with United States Government support under Contract No. W911QX-13-C-0050 awarded by the US Department of the Army. The United States Government has certain rights in this invention.

FIELD OF DISCLOSURE

The present disclosure relates to Digital to Analog Converters (DACs), and more particularly, to multiple path, cascode transistor based output switches for relatively wide bandwidth DACs.

BACKGROUND

In many applications, the output of a wide bandwidth Digital to Analog Converter (DAC) needs to be coupled through a switching mechanism to one of multiple (N) different output paths or channels, for example for subsequent filtering, processing and/or transmission over different channel frequency bands. When a particular path is selected, the other paths should generally be deactivated to reduce the loading on the DAC output, prevent impedance mismatches between the DAC output and the filter, and avoid spurious leakage between bands. Conventional switching techniques typically use an external switch (e.g., external to the DAC circuit), at which point the DAC output is already in a controlled impedance voltage mode. These external switches tend to be relatively lossy, particularly at higher speeds. Additionally, if active device switches are used, they can adversely impact the linearity of the signal.

SUMMARY

One example embodiment of the present disclosure provides a switch including a plurality of cascode transistors coupled in parallel to an output stage of a current mode digital to analog converter (DAC) circuit; a plurality of control ports, each of the control ports coupled to a gate of one of the cascode transistors; and a plurality of output ports, each output port coupled to one of the cascode transistors. Each of the cascode transistors are configured to switch the output stage of the DAC to the output port of the transistor in response to a routing control signal applied to the control port of the transistor. In some embodiments, the cascode transistors are High Electron Mobility Transistors (HEMT) fabricated from Gallium Nitride. In some embodiments, the cascode transistors are High Electron Mobility Transistors (HEMT) fabricated from Gallium Arsenide. In other embodiments, the cascode transistors are Bipolar Junction Transistors (BJT) fabricated from Indium Phosphide. In some embodiments, the DAC circuit includes Hetero Junction Bipolar Transistors (HBT) fabricated from Indium Phosphide and the DAC circuit and the switch are fabricated as components of an integrated circuit. In some further embodiment, the cascode transistors are configured as a differential pair of field effect transistors (FET) in a complementary silicon metal-oxide semiconductor (CMOS) process. In some further embodiment, the cascode transistors are configured as a differential pair of field effect transistors in a gallium nitride process. In some further embodiment, the cascode transistors are configured as a differential pair of field effect transistors in a Gallium Arsenide process. In some further embodiment, the cascode transistors are configured as a differential pair of metal semiconductor field effect transistors in a Gallium Nitride process. In some further embodiments, the DAC circuit is configured to generate a signal at the output stage, the signal comprising a peak current in the range of 90 milliamps to 200 milliamps and a frequency greater than 40 Gigahertz.

Another example embodiment of the present disclosure provides a communications system including a current mode digital to analog converter (DAC) circuit to generate an analog signal at an output stage of the DAC for transmission. The communications system further includes a switch comprising: a plurality of cascode transistors coupled in parallel to the output stage of the DAC circuit; a plurality of control ports, each of the control ports coupled to a gate of one of the cascode transistors; a plurality of output ports, each output port coupled to one of the cascode transistors. The cascode transistors are configured to switch the output stage of the DAC to the output port of the transistor in response to a routing control signal applied to the control port of the transistor. The communications system still further includes a plurality of transmitter circuits to transmit the analog signal, each of the transmitter circuits coupled to one of the output ports of the switch.

Yet, another example embodiment of the present disclosure provides a method for fabricating a switched output digital to analog converter. The method includes: coupling a plurality of cascode transistors in parallel to an output stage of a current mode digital to analog converter (DAC) circuit; providing a plurality of control ports, each of the control ports coupled to a gate of one of the cascode transistors; and providing a plurality of output ports, each output port coupled to one of the cascode transistors. The cascode transistors are configured to switch the output stage of the DAC to the output port of the transistor in response to a routing control signal applied to the control port of the transistor.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

FIG. 5 is a flowchart illustrating a methodology for fabrication of a switched output digital to analog converter, in accordance with certain of the embodiments disclosed herein.

Although the following Detailed Description will proceed with reference being made to illustrative embodiments, many alternatives, modifications, and variations thereof will be apparent to those skilled in the art.

DETAILED DESCRIPTION

Generally, this disclosure provides techniques for switching the analog output signal of a wide bandwidth, current mode Digital to Analog Converter (DAC), to one of multiple (N) output paths using a cascode transistor based switch. In some embodiments, the DAC and the cascode transistor switch are integrated components of an integrated circuit chip (IC) fabricated from mixed technologies or material chemistries. For example, the DAC may be fabricated using Indium Phosphide technology and the cascode transistor switch may be fabricated using Gallium Nitride technology. The cascode transistor switch is configured to provide a switched signal with reduced loss and improved linearity, as will be described in greater detail below, compared to conventional switching devices which are generally located external to the DAC IC.

Figure 1:
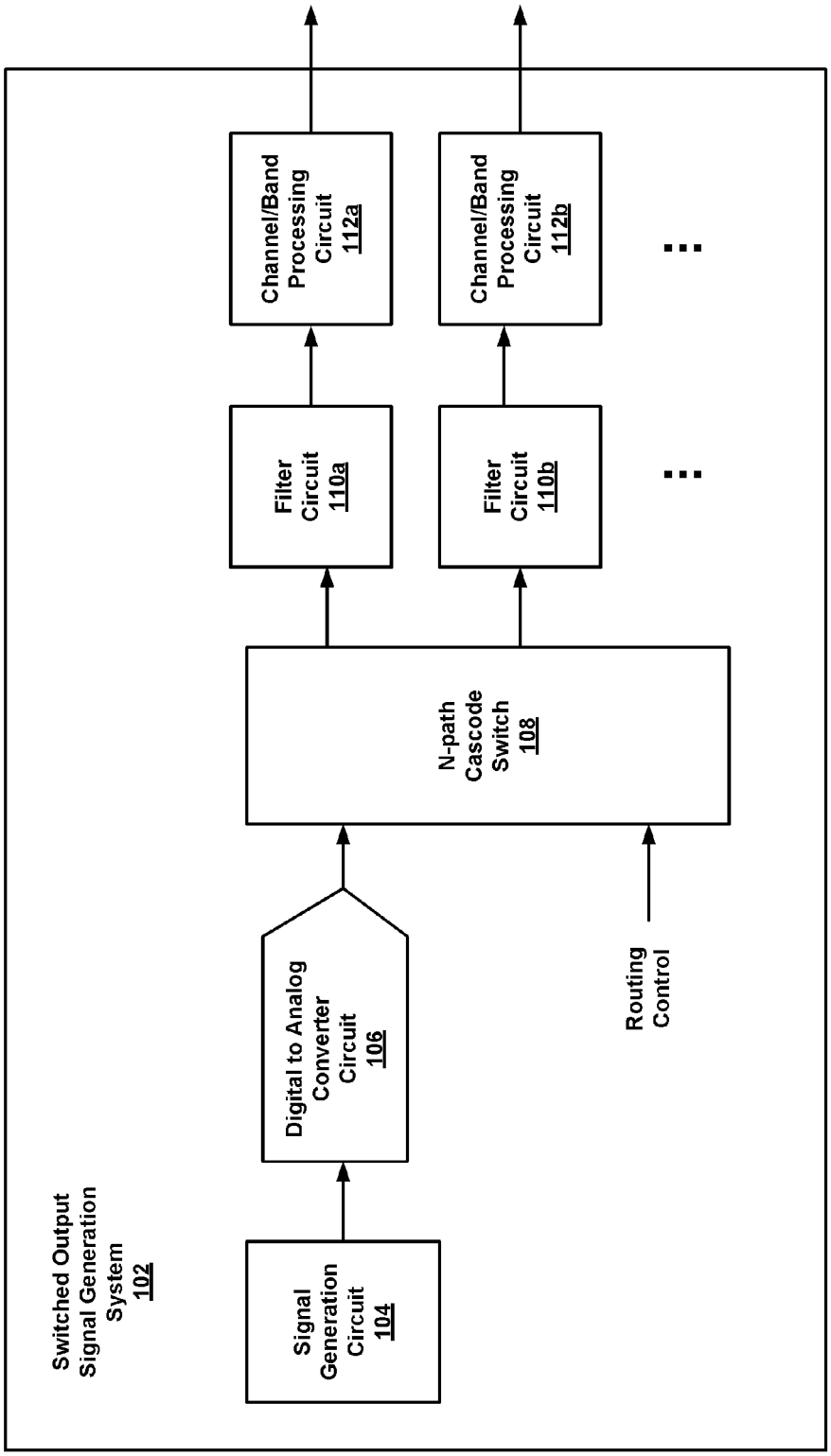
FIG. 1 is a top level system diagram of a switched output signal generation system, configured in accordance with certain of the embodiments disclosed herein.

FIG. 1 is a top level system diagram 100 of a switched output signal generation system 102, configured in accordance with certain of the embodiments disclosed herein. An example switched output signal generation system is shown to include a signal generation circuit 104, a digital to analog converter circuit 106, an N-path cascode switch 108, filter circuits 110, and channel or band processing circuits 112. The switched output signal generation system 102 may be employed as a component in the transmission circuitry of a communications platform, as will be described later in connection with FIG. 6.

The signal generation circuit 104 may be configured to generate a digital signal of any suitable format, for example to convey information intended for ultimate transmission over a wireless medium (e.g., as a radio frequency (RF) signal). The digital signal is provided to DAC circuit 106 which may be configured to convert that signal to an analog form. The N-path cascode switch 108 may be configured to route that signal to one of N paths by switching the output of the DAC 106 to circuitry associated with one of N output channels while isolating the remaining channels from the DAC, as will be described in greater detail below. Each output channel may include, for example, a filter circuit 110a, 110b, etc. configured to filter the analog signal to a desired frequency band and to route that filtered signal to a channel or band processing circuit 112a, 112b, etc. which may be configured to perform any suitable processing prior to transmission.

Figure 2:
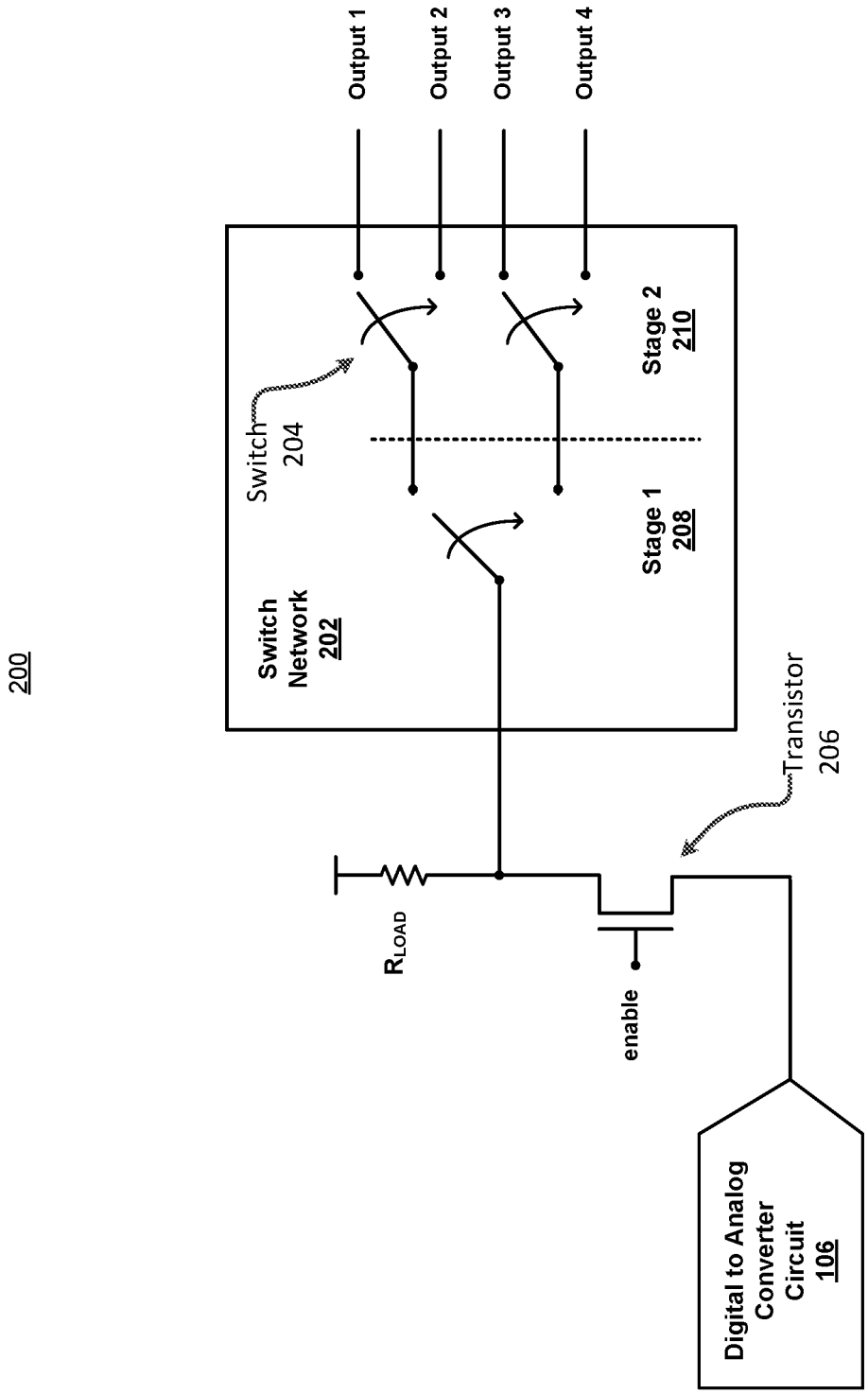
FIG. 2 is a block diagram of an output switch for a digital to analog converter.

FIG. 2 is a block diagram 200 of an example implementation of an output switch for a digital to analog converter. In this example, the output of DAC circuit 106 is routed to an external switch network 202 through a transistor 206, which may be a cascode transistor. The transistor 206 may be configured to provide a gating function, based on an enable signal, to couple the DAC circuit 106 to the switch network 202. The switch network 204 is shown to include, in this example, three switches 204 arranged in a binary tree configuration of two stages 208, 210. The switches in this type of network may be implemented as phase change switches or micro-electromechanical system (MEMS) devices. The first switch of stage 1 208 selects between one of the two paths of stage 2 210. In turn, each of the second and third switches of stage 2 210, select between one of two output paths associated with that switch (e.g., output 1 or output 2 and output 3 or output 4). Thus, the switch network may route the DAC output signal to one of four possible output paths. Unfortunately, as the signal travels through each switching stage 208, 210, the signal suffers from some degree of attenuation or loss. In some cases, the additional loss imposed by switching network 202 may be on the order of 1.3 decibels (dB) or more.

Figure 3:
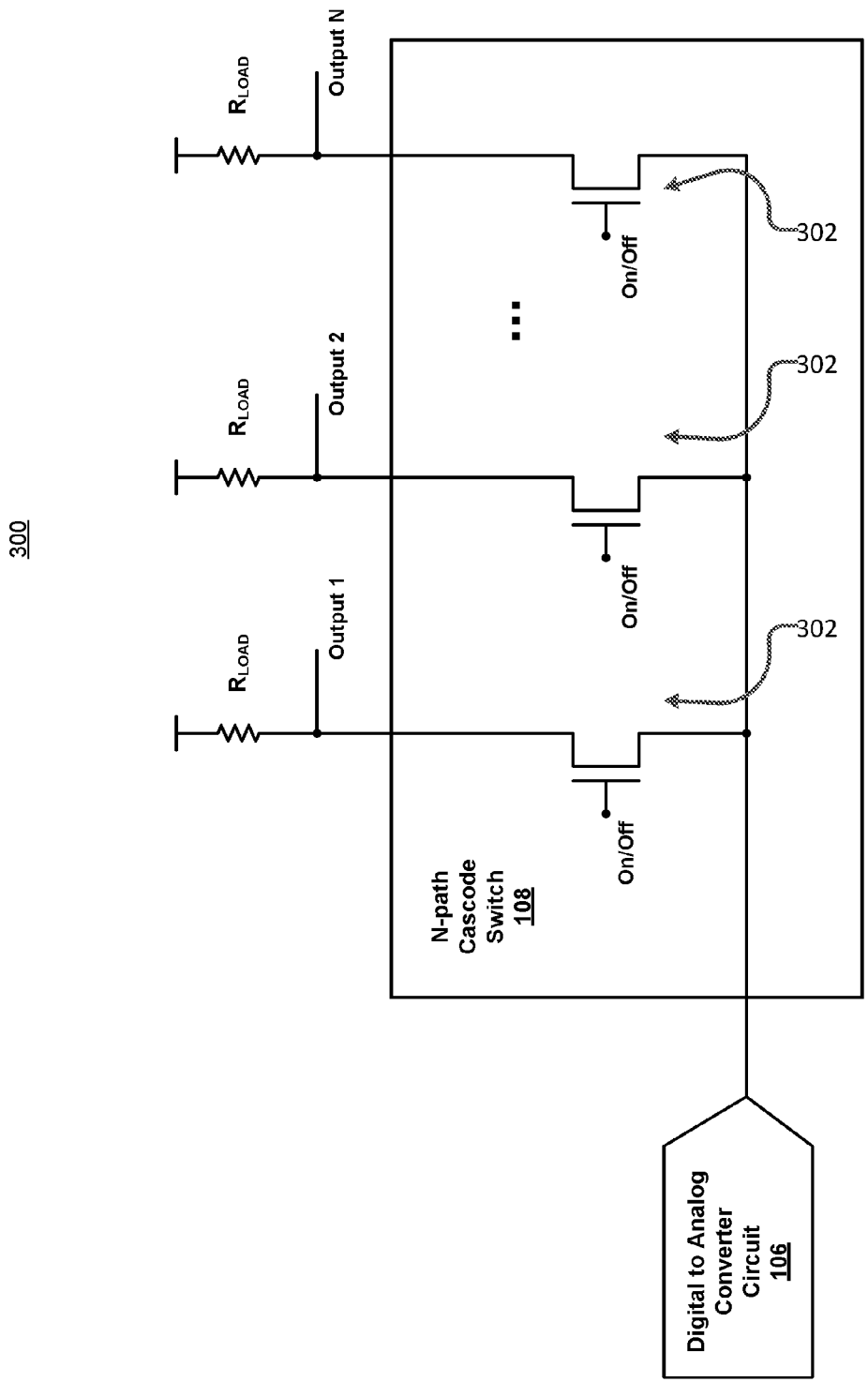
FIG. 3 is a block diagram of a cascode output switch for a digital to analog converter, configured in accordance with certain of the embodiments disclosed herein.

FIG. 3 is a block diagram 300 of a cascode output switch for a digital to analog converter, configured in accordance with certain of the embodiments disclosed herein. The N-path cascode transistor based switch 108 is shown to include N cascode transistors 302 coupled in parallel to the output stage of the DAC circuit 106. The DAC circuit 106 may be configured as a current mode DAC. Each cascode transistor 302 has a control port coupled to the gate of the transistor. The control port is configured to turn that transistor on or off (e.g., bias that transistor to an on or off state) in response to a routing control signal. Each cascode transistor 302 also has an output port. The transistor is configured to switch the coupling of the DAC output stage to the transistor output port in response to the routing control signal applied to the control port. The routing control signal may be provided by external control circuitry configured to determine which of N output paths the signal should be routed to any given time. Typically only one of the cascode transistors 302 is turned on at particular time to reduce the load on the DAC output, prevent impedance mismatches between the DAC output and the filter, and avoid spurious leakage between bands/channels.

Generally, a current-mode DAC has relatively high output impedance and generates a relatively large current, making it feasible to drive a cascode transistor, which is biased to an on state when activated in such a way that its input impedance is low from the perspective of the DAC. When the other parallel cascode transistors (that couple to non-selected or unused output paths) are turned off, the output impedance of those cascode transistors is substantially increased. This high output impedance of the deactivated cascode transistors is placed in parallel with the low impedance active path and virtually all of the DAC output current is channeled through the single selected output path.

The cascode transistors illustrated in this embodiment are configured in a single-ended arrangement, as opposed to a differential pair configuration shown below in FIG. 4. In some embodiments, the cascode transistors 302 may be configured as High Electron Mobility Transistors (HEMT) fabricated from Gallium Nitride (GaN) (e.g., the transistor employs GaN technology). In other embodiments, the cascode transistors may be configured as HEMT devices fabricated in Gallium Aresenide (GaAs). In other embodiments, the cascode transistors may be configured as Bipolar Junction Transistors fabricated from Indium Phosphide (InP). In still other embodiments, the cascode transistors may be configured as Field Effect Transistors (FETs) fabricated from silicon. In still other embodiments, the cascode transistors may be configured as Field Effect Transistors (FETs) fabricated from Gallium Arsenide (GaAs). In still other embodiments, the cascode transistors may be configured as Field Effect Transistors (FETs) fabricated from Gallium Nitride (GaN).

In some embodiments, the DAC circuit 106 may be configured to employ Hetero Junction Bipolar Transistors (HBT) fabricated from Indium Phosphide. The DAC circuit 106 is configured to generate a signal at the output stage which may exhibit a peak current in the range of 90 milliamps to 200 milliamps (which may correspond to an output power in the range of 23 to 30 dBm) and a frequency greater than 40 Gigahertz (GHz).

In some embodiments, the DAC circuit 106 and the N-path cascode switch 108 may be fabricated as components of an integrated circuit. For example, the DAC circuit 106 and the switch 108 may each be fabricated using different fabrication technologies and then combined within a heterogeneous integrated circuit process.

Figure 4:
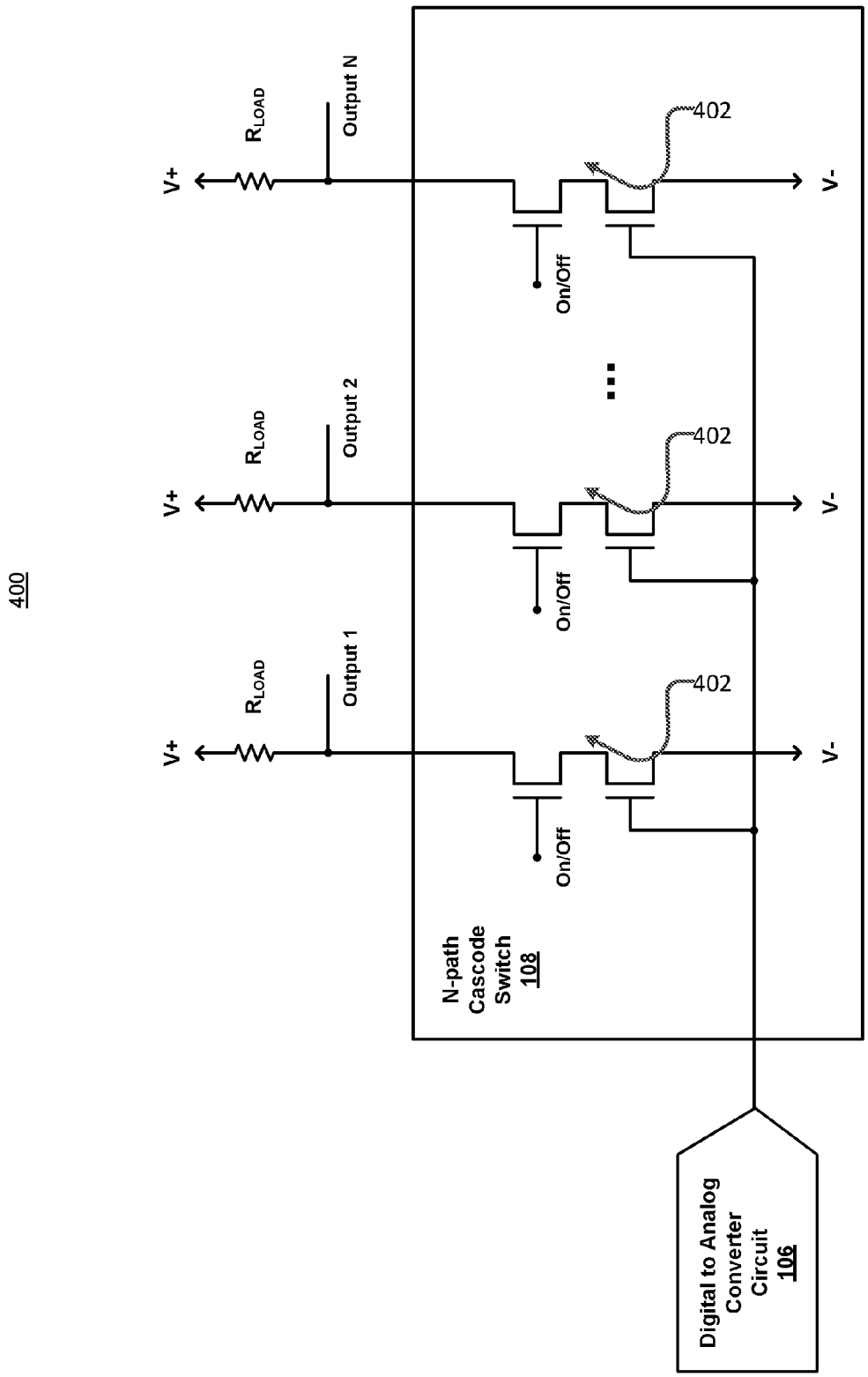
FIG. 4 is a block diagram of another cascode output switch for a digital to analog converter, configured in accordance with certain of the embodiments disclosed herein.

FIG. 4 is a block diagram 400 of another cascode output switch for a digital to analog converter, configured in accordance with certain of the embodiments disclosed herein. The N-path cascode transistor based switch 108 shown in this alternative embodiment is similar to that shown previously in FIG. 3 with the exception that each of the cascode transistors 402 are configured as a differential pair of transistors.

Further advantages of the N-path cascode transistor based switch 108, as configured in either FIG. 3 (single ended) or FIG. 4 (differential), over the switch network 202 illustrated in FIG. 2, will be apparent to one of ordinary skill in the art. For example, the cascode transistor switches generally exhibit reduced loss, higher potential switching speeds and improved linearity compared to the phase change switches or MEMS switches of network 202. Furthermore, additional efficiencies (e.g., in cost, reliability, etc.) may be obtained by integrating the cascode transistors 302 and 402 into the integrated circuit that hosts the DAC 106.

Methodology

FIG. 5 is a flowchart illustrating an example method 500 for fabrication of a switched output digital to analog converter (DAC), in accordance with an embodiment of the present disclosure. As can be seen, example method 500 includes a number of phases and sub-processes, the sequence of which may vary from one embodiment to another. However, when considered in the aggregate, these phases and sub-processes form a fabrication process for a switched output DAC in accordance with certain of the embodiments disclosed herein. These embodiments can be implemented, for example using the system architecture illustrated in FIGS. 3 and 4, as described above. However other system architectures can be used in other embodiments, as will be apparent in light of this disclosure. To this end, the correlation of the various functions shown in FIG. 5 to the specific components illustrated in FIGS. 3 and 4 is not intended to imply any structural and/or use limitations. Rather other embodiments may include, for example, varying degrees of integration wherein multiple functionalities are effectively performed by one system. For example, in an alternative embodiment a single module can be used to perform all of the functions of method 500. Thus other embodiments may have fewer or more modules and/or sub-modules depending on the granularity of implementation. Numerous variations and alternative configurations will be apparent in light of this disclosure.

As illustrated in FIG. 5, in one embodiment switched output DAC fabrication method 500 commences by coupling, at operation 510, a plurality of cascode transistors in parallel to an output stage of a current mode digital to analog converter (DAC) circuit. Next, at operation 520, a plurality of control ports is provided. Each of the control ports is coupled to a gate of one of the cascode transistors. At operation 530, a plurality of output ports is provided. Each output port is coupled to one of the cascode transistors the cascode transistors are configured to switch the output stage of the DAC to the output port of the transistor in response to a routing control signal applied to the control port of the transistor.

Of course, in some embodiments, additional operations may be performed, as previously described in connection with the system. These additional operations may include, for example, configuring the cascode transistors as High Electron Mobility Transistors (HEMT) fabricated from Gallium Nitride. Additionally, in some embodiments, the cascode transistors may be configured as Bipolar Junction Transistors or Field Effect Transistors fabricated from Indium Phosphide.

Example System

Figure 6:
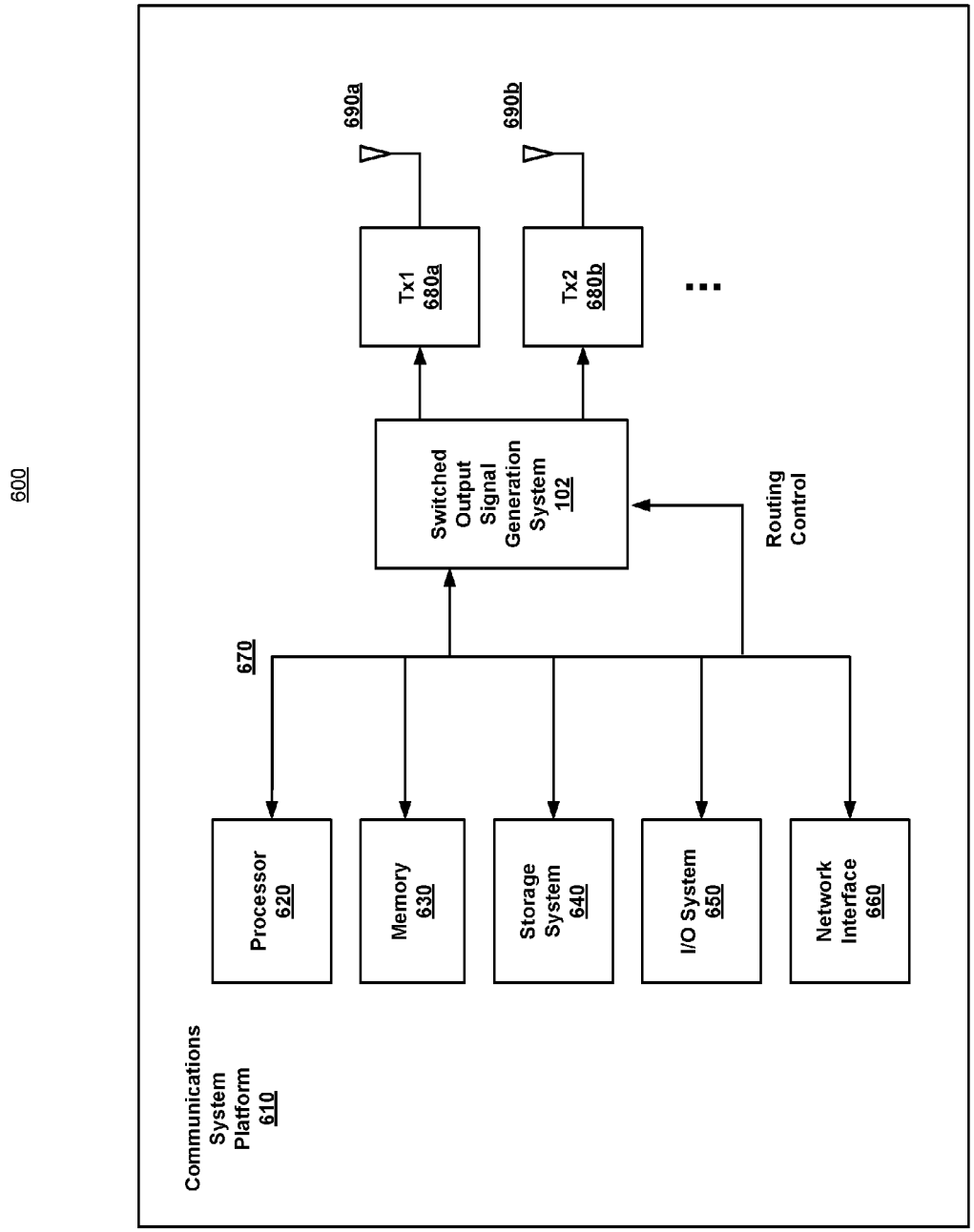
FIG. 6 is a block diagram schematically illustrating a communications system platform, configured in accordance with certain of the embodiments disclosed herein.

FIG. 6 illustrates an example system 600 that may employ a cascode switched output digital to analog converter, as described herein. In some embodiments, system 600 comprises a communications system platform 610 which may host, or otherwise be incorporated into, a personal computer, workstation, laptop computer, ultra-laptop computer, tablet, touchpad, portable computer, handheld computer, palmtop computer, personal digital assistant (PDA), cellular telephone, cellular telephone base station, microcell or picocell base station, Wi-Fi base station and so forth. Any combination of different devices may be used in certain embodiments.

In some embodiments, communications system platform 610 may comprise any combination of a processor 620, a memory 630, a storage system 640, an input/output (I/O) system 650, a network interface 660, a switched output signal generation system 102, transmitters 680 and antennas 690. As can be further seen, a bus and/or interconnect 670 is also provided to allow for communication between the various components listed above and/or other components not shown. Platform 610 can be coupled to a network through network interface 660 to allow for communications with other computing devices, platforms, network elements or resources. Other componentry and functionality not reflected in the block diagram of FIG. 6 will be apparent in light of this disclosure, and it will be appreciated that other embodiments are not limited to any particular hardware configuration.

Processor 620 can be any suitable processor, and may include one or more coprocessors or controllers, such as an audio processor or a graphics processing unit, to assist in control and processing operations associated with system 600. In some embodiments, the processor 620 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 620 may be implemented as a complex instruction set computer (CISC) or a reduced instruction set computer (RISC) processor.

Memory 630 can be implemented using any suitable type of digital storage including, for example, flash memory and/or random access memory (RAM). In some embodiments, the memory 630 may include various layers of memory hierarchy and/or memory caches as are known to those of skill in the art. Memory 630 may be implemented as a volatile memory device such as, but not limited to, a RAM, dynamic RAM (DRAM), or static RAM (SRAM) device. Storage system 640 may be implemented as a non-volatile storage device such as, but not limited to, one or more of a hard disk drive (HDD), a solid state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 640 may comprise technology to increase the storage performance enhanced protection for valuable digital media when multiple hard drives are included.

I/O system 650 may be configured to interface between various I/O devices and other components of computer system 600. I/O devices may include, but not be limited to, a display element, microphone, speaker, keyboard, mouse, etc.

Network interface module 660 can be any appropriate network chip or chipset which allows for wired and/or wireless connection between other components of computer system 600 and/or the network, thereby enabling system 600 to communicate with other local and/or remote computing systems, servers, and/or resources. Wired communication may conform to existing (or yet to developed) standards, such as, for example, Ethernet. Wireless communication may conform to existing (or yet to developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

It will be appreciated that in some embodiments, the various components of the system 100 may be combined or integrated in a system-on-a-chip (SoC) architecture. In some embodiments, the components may be hardware components, firmware components, software components or any suitable combination of hardware, firmware or software.

Switched output signal generation system 102 is configured to switch an analog output signal of a DAC to one of N output channels using a cascode transistor based switch, as described previously. Switched output signal generation system 102 may include any or all of the components illustrated in FIGS. 1, 3 and 4 described above. Switched output signal generation system 102 may also interact with other components of platform 610 that are configured for communicating over a wireless shared media, such as one or more transmitters 680, antennas 690, amplifiers, filters, and so forth. An example of wireless shared media may include portions of a wireless spectrum, such as the radio frequency spectrum and so forth. Of course other signal transmission mechanisms are also possible, such as, for example conversion of the analog signal from an electrical signal to an optical signal for transmission over an optical fiber network.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a switch comprising: a plurality of cascode transistors coupled in parallel to an output stage of a current mode digital to analog converter (DAC) circuit; a plurality of control ports, each of the control ports coupled to a gate of one of the cascode transistors; and a plurality of output ports, each output port coupled to one of the cascode transistors, wherein the cascode transistors are configured to switch the output stage of the DAC to the output port of the transistor in response to a routing control signal applied to the control port of the transistor.

Example 2 includes the subject matter of Example 1, wherein the cascode transistors are High Electron Mobility Transistors (HEMT) fabricated from Gallium Nitride.

Example 3 includes the subject matter of Examples 1 and 2, wherein the cascode transistors are High Electron Mobility Transistors (HEMT) fabricated from Gallium Arsenide.

Example 4 includes the subject matter of Examples 1-3, wherein the cascode transistors are Bipolar Junction Transistors fabricated from Indium Phosphide.

Example 5 includes the subject matter of Examples 1-4, wherein the cascode transistors are Field Effect Transistors fabricated from Silicon.

Example 6 includes the subject matter of Examples 1-5, wherein the cascode transistors are Field Effect Transistors fabricated from Gallium Nitride.

Example 7 includes the subject matter of Examples 1-6, wherein the cascode transistors are Field Effect Transistors fabricated from Gallium Arsenide.

Example 8 includes the subject matter of Examples 1-7, wherein the DAC circuit comprises Hetero Junction Bipolar Transistors (HBT) fabricated from Indium Phosphide.

Example 9 includes the subject matter of Examples 1-8, wherein the DAC circuit and the switch are fabricated based on different fabrication technologies and combined within a heterogeneous integrated circuit process.

Example 10 includes the subject matter of Examples 1-9, wherein each of the cascode transistors are configured as a differential pair of transistors.

Example 11 includes the subject matter of Examples 1-10, wherein the DAC circuit is configured to generate a signal at the output stage, the signal comprising a peak current in the range of 90 milliamps to 200 milliamps and a frequency greater than 40 Gigahertz.

Example 12 is a communications system comprising a current mode digital to analog converter (DAC) circuit to generate an analog signal at an output stage of the DAC for transmission. The communications system also includes a switch comprising: a plurality of cascode transistors coupled in parallel to the output stage of the DAC circuit; a plurality of control ports, each of the control ports coupled to a gate of one of the cascode transistors; a plurality of output ports, each output port coupled to one of the cascode transistors, wherein the cascode transistors are configured to switch the output stage of the DAC to the output port of the transistor in response to a routing control signal applied to the control port of the transistor. The communications system further includes a plurality of transmitter circuits to transmit the analog signal, each of the transmitter circuits coupled to one of the output ports of the switch.

Example 13 includes the subject matter of Example 12, wherein the cascode transistors are High Electron Mobility Transistors (HEMT) fabricated from Gallium Nitride or Gallium Arsenide.

Example 14 includes the subject matter of Examples 12 and 13, wherein the cascode transistors are Bipolar Junction Transistors fabricated from Indium Phosphide.

Example 15 includes the subject matter of Examples 12-14, wherein the cascode transistors are Field Effect Transistors fabricated from Silicon or Gallium Nitride or Gallium Arsenide.

Example 16 includes the subject matter of Examples 12-15, wherein the DAC circuit comprises Hetero Junction Bipolar Transistors (HBT) fabricated from Indium Phosphide.

Example 17 includes the subject matter of Examples 12-16, wherein each of the cascode transistors are configured as a differential pair of transistors.

Example 18 includes the subject matter of Examples 12-17, wherein the DAC circuit generated analog signal comprises a peak current in the range of 90 milliamps to 200 milliamps and a frequency greater than 40 Gigahertz.

Example 19 includes the subject matter of Examples 12-18, further comprising a plurality of bandpass filter circuits, each of the filter circuits coupled between one of the output ports of the switch and the associated transmitter circuit.

Example 20 is a method for fabricating a switched output digital to analog converter. The method comprises: coupling a plurality of cascode transistors in parallel to an output stage of a current mode digital to analog converter (DAC) circuit; providing a plurality of control ports, each of the control ports coupled to a gate of one of the cascode transistors; and providing a plurality of output ports, each output port coupled to one of the cascode transistors, wherein the cascode transistors are configured to switch the output stage of the DAC to the output port of the transistor in response to a routing control signal applied to the control port of the transistor.

Example 21 includes the subject matter of Example 20, further comprising configuring the cascode transistors as High Electron Mobility Transistors (HEMT) fabricated from Gallium Nitride or Gallium Arsenide.

Example 22 includes the subject matter of Examples 20 and 21, further comprising configuring the cascode transistors as Bipolar Junction Transistors fabricated from Indium Phosphide.

Example 23 includes the subject matter of Examples 20-22, further comprising configuring the cascode transistors as Field Effect Transistors fabricated from Silicon or Gallium Nitride or Gallium Arsenide.

Example 24 includes the subject matter of Examples 20-23, wherein the DAC circuit comprises Hetero Junction Bipolar Transistors (HBT) fabricated from Indium Phosphide.

Example 25 includes the subject matter of Examples 20-24, further comprising configuring each of the cascode transistors as a differential pair of transistors.

Example 26 includes the subject matter of Examples 20-25, further comprising fabricating the DAC circuit and the switch based on different fabrication technologies and combining the DAC circuit and the switch within a heterogeneous integrated circuit process.

Example 27 includes the subject matter of Examples 20-26, further comprising configuring the DAC circuit to generate a signal at the output stage, the signal comprising a peak current in the range of 90 milliamps to 200 milliamps and a frequency greater than 40 Gigahertz.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A switch comprising:
    a plurality of cascode transistors coupled in parallel to an output stage of a current mode digital to analog converter (DAC) circuit;
    a plurality of control ports, each of the control ports coupled to a gate of one of the cascode transistors; and
    a plurality of output ports, each output port coupled to one of the cascode transistors, wherein the cascode transistors are configured to switch the output stage of the DAC to the output port of the transistor in response to a routing control signal applied to the control port of the transistor,
    wherein the DAC circuit and the switch are fabricated based on different fabrication technologies and combined within a heterogeneous integrated circuit process.

2. The switch of claim 1, wherein the cascode transistors are High Electron Mobility Transistors (HEMT) fabricated from Gallium Nitride.

3. The switch of claim 1, wherein the cascode transistors are High Electron Mobility Transistors (HEMT) fabricated from Gallium Arsenide.

4. The switch of claim 1, wherein the cascode transistors are Bipolar Junction Transistors fabricated from Indium Phosphide.

5. The switch of claim 1, wherein the cascode transistors are Field Effect Transistors fabricated from Silicon.

6. The switch of claim 1, wherein the cascode transistors are Field Effect Transistors fabricated from Gallium Nitride.

7. The switch of claim 1, wherein the cascode transistors are Field Effect Transistors fabricated from Gallium Arsenide.

8. The switch of claim 1, wherein the DAC circuit comprises Hetero Junction Bipolar Transistors (HBT) fabricated from Indium Phosphide.

9. The switch of claim 1, wherein each of the cascode transistors are configured as a differential pair of transistors.

10. The switch of claim 1, wherein the DAC circuit is configured to generate a signal at the output stage, the signal comprising a peak current in the range of 90 milliamps to 200 milliamps and a frequency greater than 40 Gigahertz.

11. A communications system comprising:
    a current mode digital to analog converter (DAC) circuit to generate an analog signal at an output stage of the DAC for transmission;
    a switch comprising:
        a plurality of cascode transistors coupled in parallel to the output stage of the DAC circuit;
        a plurality of control ports, each of the control ports coupled to a gate of one of the cascode transistors;
        a plurality of output ports, each output port coupled to one of the cascode transistors, wherein the cascode transistors are configured to switch the output stage of the DAC to the output port of the transistor in response to a routing control signal applied to the control port of the transistor; and
    a plurality of transmitter circuits to transmit the analog signal, each of the transmitter circuits coupled to one of the output ports of the switch.

12. The communications system of claim 11, wherein the cascode transistors are High Electron Mobility Transistors (HEMT) fabricated from Gallium Nitride or Gallium Arsenide.

13. The communications system of claim 11, wherein the cascode transistors are Bipolar Junction Transistors fabricated from Indium Phosphide.

14. The communications system of claim 11, wherein the cascode transistors are Field Effect Transistors fabricated from Silicon or Gallium Nitride or Gallium Arsenide.

15. The communications system of claim 11, wherein the DAC circuit comprises Hetero Junction Bipolar Transistors (HBT) fabricated from Indium Phosphide.

16. The communications system of claim 11, wherein each of the cascode transistors are configured as a differential pair of transistors.

17. The communications system of claim 11, wherein the DAC circuit generated analog signal comprises a peak current in the range of 90 milliamps to 200 milliamps and a frequency greater than 40 Gigahertz.

18. The communications system of claim 11, further comprising a plurality of bandpass filter circuits, each of the filter circuits coupled between one of the output ports of the switch and the associated transmitter circuit.

19. A method for fabricating a switched output digital to analog converter, the method comprising:
    coupling a plurality of cascode transistors in parallel to an output stage of a current mode digital to analog converter (DAC) circuit;
    providing a plurality of control ports, each of the control ports coupled to a gate of one of the cascode transistors; and providing a plurality of output ports, each output port coupled to one of the cascode transistors, wherein the cascode transistors are configured to switch the output stage of the DAC to the output port of the transistor in response to a routing control signal applied to the control port of the transistor, further comprising configuring the DAC circuit to generate a signal at the output stage, the signal comprising a peak current in the range of 90 milliamps to 200 milliamps and a frequency greater than 40 Gigahertz.

20. The method of claim 19, further comprising configuring the cascode transistors as High Electron Mobility Transistors (HEMT) fabricated from Gallium Nitride or Gallium Arsenide.

21. The method of claim 19, further comprising configuring the cascode transistors as Bipolar Junction Transistors fabricated from Indium Phosphide.

22. The method of claim 19, further comprising configuring the cascode transistors as Field Effect Transistors fabricated from Silicon or Gallium Nitride or Gallium Arsenide.

23. The method of claim 19, wherein the DAC circuit comprises Hetero Junction Bipolar Transistors (HBT) fabricated from Indium Phosphide.

24. The method of claim 19, further comprising configuring each of the cascode transistors as a differential pair of transistors.

25. The method of claim 19, further comprising fabricating the DAC circuit and the switch based on different fabrication technologies and combining the DAC circuit and the switch within a heterogeneous integrated circuit process.

* * * * *